United States Patent
Pan et al.

(10) Patent No.: US 10,436,823 B2
(45) Date of Patent: Oct. 8, 2019

(54) SYSTEMS AND METHODS FOR SWING ANGLE ESTIMATION IN AN ELECTRICAL POWER SYSTEM

(71) Applicant: GENERAL ELECTRIC COMPANY, Schenectady, NY (US)

(72) Inventors: Yan Pan, Niskayuna, NY (US); William James Premerlani, Scotia, NY (US)

(73) Assignee: General Electric Company, Schenectady, NY (US)

( * ) Notice: Subject to any disclaimer, the term of this patent is extended or adjusted under 35 U.S.C. 154(b) by 1301 days.

(21) Appl. No.: 14/519,526

(22) Filed: Oct. 21, 2014

(65) Prior Publication Data
US 2015/0051852 A1 Feb. 19, 2015

Related U.S. Application Data

(63) Continuation-in-part of application No. 13/968,684, filed on Aug. 16, 2013, now Pat. No. 10,024,920.

(51) Int. Cl.
- *G01R 21/133* (2006.01)
- *G01R 25/00* (2006.01)
- *H02J 3/24* (2006.01)

(52) U.S. Cl.
CPC .......... *G01R 21/133* (2013.01); *G01R 25/00* (2013.01); *H02J 3/24* (2013.01)

(58) Field of Classification Search
CPC .......... G01R 21/133; G01R 25/00; H02J 3/24
See application file for complete search history.

(56) References Cited

U.S. PATENT DOCUMENTS

| 5,731,943 A | 3/1998 | Roberts et al. |
| 6,104,182 A | 8/2000 | Jurisch et al. |
| 6,476,521 B1 | 11/2002 | Lof et al. |

(Continued)

FOREIGN PATENT DOCUMENTS

| CN | 1429043 A | 7/2003 |
| CN | 101807789 A | 8/2010 |

(Continued)

OTHER PUBLICATIONS

Mechraoui A et al., "A New Blocking Principle With Phase And Earth Fault Detection During Fast Power Swings For Distance Protection", IEEE Transactions on Power Delivery, IEEE Service center, New York, vol. No. 10, Issue No. 3, pp. 1242-1248, Jul. 1, 1995.

(Continued)

*Primary Examiner* — Regis J Betsch
*Assistant Examiner* — Jeremy A Delozier
(74) *Attorney, Agent, or Firm* — Armstrong Teasdale LLP

(57) ABSTRACT

A method includes obtaining a voltage phasor, a current phasor and a mechanical rotor angle of a source end generator. A receiving end generator impedance and a line impedance between the source end generator and a receiving end generator is also estimated. Furthermore, a swing angle between an internal voltage of the source end generator and an internal voltage of the receiving end generator as a function of obtained voltage phasor, current phasor, mechanical rotor angle and the impedances is estimated. A power swing condition is then determined based on the estimated swing angle.

15 Claims, 4 Drawing Sheets

(56) References Cited

U.S. PATENT DOCUMENTS

| | | | |
|---|---|---|---|
| 6,778,919 B1* | 8/2004 | Holbach | H02J 3/24 324/124 |
| 7,457,088 B2 | 11/2008 | Hou et al. | |
| 7,710,729 B2 | 5/2010 | Li et al. | |
| 7,930,117 B2 | 4/2011 | Guzman-Casillas | |
| 8,340,930 B2 | 4/2012 | Gajic | |
| 8,207,708 B2 | 6/2012 | Morinaga et al. | |
| 8,369,055 B2 | 2/2013 | Cvorovic et al. | |
| 2006/0067095 A1* | 3/2006 | Hou | H02J 3/24 363/78 |
| 2009/0089608 A1 | 4/2009 | Guzman-Casillas | |
| 2011/0022240 A1 | 1/2011 | Rajapaske | |
| 2011/0102952 A1 | 5/2011 | Yelgin | |
| 2012/0123602 A1 | 5/2012 | Sun et al. | |
| 2012/0292904 A1 | 11/2012 | Tarnowski | |
| 2013/0066480 A1 | 3/2013 | Glavic et al. | |
| 2014/0032138 A1* | 1/2014 | Shrestha | G01R 31/40 702/58 |
| 2014/0071565 A1 | 3/2014 | Blumschein et al. | |
| 2014/0118864 A1 | 5/2014 | Som et al. | |

FOREIGN PATENT DOCUMENTS

| | | |
|---|---|---|
| EP | 0869599 A2 | 10/1998 |
| JP | 3257386 A | 11/1991 |
| JP | 4092617 B2 | 5/2008 |

OTHER PUBLICATIONS

Segui T et al., "Fundamental Basis for Distance Relaying with Parametrical Estimation", IEEE Transactions on Power Delivery, IEEE Service center, New York, vol. No. 15, Issue No. 2, Apr. 1, 2000.

Benmouyal et al., "Zero-Setting Power-Swing Blocking Protection", Schweitzer Engineering Laboratories, Inc, pp. 1-29, 2004.

Khoradshadi-Zadeh, "Evaluation and Performance Comparison of Power Swing Detection Algorithms", IEEE Power Engineering Society General Meeting, vol. 2, pp. 1842-1848, Jun. 12-16, 2005.

Danku et al., "Fast Prediction of the Power-Swing Curve Across Transmission Lines During Wide Area Disturbances", Power Systems Conference, PSC '09, Clemson, SC, pp. 1-5, Mar. 10-13, 2009.

Fischer et al.,"Do System Impedances Really Affect Power Swings—Applying Power Swing Protection Elements Without Complex System Studies", Previously presented at the 2012 Texas A&M Conference for Protective Relay Engineers, pp. 1-12, Mar. 15, 2013.

European Search Report and Opinion issued in connection with corresponding EP Application No. 14180548.1 dated Aug. 28, 2015.

C. Liu et al, "Application of a Novel Fuzzy Neural Network to Real-Time Transient Stability Swings Prediction Based on Synchronized Phasor Measurements," IEEE Transactions on Power Systems, vol. 14, No. 2, May 1999.

U.S. Non-Final Office Action issued in connection with related U.S. Appl. No. 13/968,684 dated Nov. 3, 2016.

Stanton et al., "A Center-of-Inertia Transform Applied to Transient Responses of Nonlinear Power Systems", Proceedings of the Twenty-First Annual North-American Power Symposium, pp. 205-210, Oct. 1989.

Paudyal et al., "Application of Equal Area Criterion Conditions in the Time Domain for Out-of-Step Protection", IEEE Transactions on Power Delivery, vol. No. 25, Issue No. 02, pp. 600-609, Apr. 2010.

European Search Report and Opinion issued in connection with corresponding EP Application No. 15190082.6 dated Aug. 18, 2016.

\* cited by examiner

SYSTEMS AND METHODS FOR SWING ANGLE ESTIMATION IN AN ELECTRICAL POWER SYSTEM

CROSS REFERENCE TO RELATED APPLICATIONS

This Application is a continuation-in-part of U.S. patent application Ser. No. 13/968,684, filed Aug. 16, 2013, which application is herein incorporated by reference.

BACKGROUND

An electrical power system operates under a steady-state condition when there exists a balance between generated and consumed active power for the system. Power system disturbances may cause oscillations in machine rotor angles that can result in conditions like a power swing, when internal voltages of system generators slip relative to each other. Power system faults, line switching, generator disconnection, or the loss or sudden application of large amounts of load are examples of system disturbances that may cause a power swing event to occur in a power system. Depending on the severity of the disturbance and power system control actions, the system may return to a stable state or experience a large separation of load angle and eventually lose synchronism. Large power swings, stable or unstable, may cause unwanted relay operations at different locations in the system, which can aggravate the system disturbance and can result in major power outages or blackouts.

Further, asynchronous operation of interconnected generators in the power system as an effect of unstable power swing may initiate uncontrolled tripping of circuit breakers resulting in equipment damage and posing a safety concern for utility operators. Therefore, the asynchronous system areas may need to be separated from each other quickly and dynamically in order to avoid extensive equipment damage and shutdown of major portions of the system. In order to contain these risks, it is required as per international standards to have an optimal generator protection device, such as a generator relay, in place to isolate generators from the rest of the system within a half-slip cycle. The need to meet the international standards challenges protection engineers to ensure selective and reliable relay operation.

In a conventional relaying approach, a variation in system impedance determined at generator terminals is analyzed for detecting power swing. Various impedance-based protection approaches including power swing block (PSB) and out-of step trip (OST) are currently being used. However, these protection approaches may need an extensive power system stability study to arrive at an optimal setting for selective and reliable relay operation. Protection engineers typically use preliminary settings that are not adapted to accommodate variation in system configurations or operational dynamics, for example, changes in transmission and distribution layout during implementation phase or dynamically during operational phase. Extensive study and non-dynamic preliminary settings may result in the protection device being unable to selectively, reliably and dependably detect power swings and isolate generators during such events.

Other known relaying approaches estimate swing center voltage (SCV) for detecting power swings. Such approaches use approximate estimation that does not take into consideration real time power system dynamics. In some relaying approaches, a high-speed communication network such as fiber optic or global positioning system (GPS) communication is used to obtain data at a source end from one or more generators at receiving end(s), which is at a remote location from the source end, for SCV estimation. However, such approaches have economic challenges due to the cost associated with implementing and maintaining a high-speed communication network. Some approaches for SCV directly measure the rotor angle between the generator's internal voltage and terminal voltage for detecting power swing. In the absence of direct measurements, it is difficult to determine the power swing condition.

BRIEF DESCRIPTION

In accordance with an embodiment of the present technique, a method comprising steps of obtaining a voltage phasor, a current phasor and a mechanical rotor angle of a source end generator is provided. The method further includes estimating a receiving end generator impedance and a line impedance between the source-end generator and the receiving-end generator. The method also includes estimating a swing angle between an internal voltage of the source-end generator and an internal voltage of the receiving-end generator as a function of the obtained voltage phasor, current phasor, the mechanical rotor angle and the estimated impedances. A power swing condition is then determined based on estimated swing angle In accordance with another embodiment of the present technique, a power swing detection devices is provided. The power swing detection device includes a voltage determination module configured to obtain a voltage phasor of a source-end generator, a current determination module configured to obtain a current phasor of the source-end generator, and a rotor angle determination module configured to obtain a mechanical rotor angle of the source end generator. The system also includes an impedance estimation module configured to estimate a receiving end generator impedance and a line impedance between the source-end generator and the receiving-end generator. The system further includes a swing angle estimation module configured to estimate a swing angle between an internal voltage of the source-end generator and an internal voltage of the receiving-end generator as a function of the voltage phasor, current phasor, the mechanical rotor angle and the estimated impedances. A detection module is also provided and is configured to detect a power swing condition based on the estimated swing angle.

In accordance with yet another embodiment of the present technique, an electrical power system is provided. The system includes a receiving-end generator, a source-end generator configured to be electrically coupled to the receiving-end generator and a power swing detection device. The power swing detection device includes a voltage determination module configured to obtain a voltage phasor of a source-end generator, a current determination module configured to obtain a current phasor of the source-end generator, and a rotor angle determination module configured to obtain a mechanical rotor angle of the source end generator. The system also includes an impedance estimation module configured to estimate a receiving end generator impedance and a line impedance between the source-end generator and the receiving-end generator. The system further includes a swing angle estimation module configured to estimate a swing angle between an internal voltage of the source-end generator and an internal voltage of the receiving-end generator as a function of the voltage phasor, current phasor, the mechanical rotor angle and the estimated impedances. A detection module is also provided and is configured to detect a power swing condition based on the estimated swing angle

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of terms such as "including," "comprising," or "having" and variations thereof herein are meant to encompass the items listed thereafter and equivalents thereof as well as additional items. The term "module" or "controller" refers to software, hardware, or firmware, or any combination of these, or any system, process, or functionality that performs or facilitates the processes described herein.

Additionally, for purposes of explanation, specific numbers, materials, and configurations are set forth in order to provide a thorough understanding of various embodiments of the invention. The skilled artisan will recognize the interchangeability of various features from different embodiments. Similarly, the various method steps and features described, as well as other known equivalents for each such methods and features, can be mixed and matched by one of ordinary skill in this art to construct additional assemblies and techniques in accordance with principles of this disclosure.

Various embodiments of the present technique provide devices and methods to detect a power swing condition (herein referred to as "power swing") in an electrical power system based on local measurements and one or more system parameters. In various embodiments, the devices and methods may obtain local measurements including a voltage phasor ($V_S$) of a source-end generator in the electrical system and a current phasor ($I_S$) of the source-end generator. Various embodiments may further estimate one or more system parameters such as a transmission line impedance ($Z_L$) between a source-end generator and a receiving-end generator and furthermore, a receiving end generator impedance ($Z_R$), for example. In some embodiments, a swing angle (θ) between an internal voltage ($E_S$) of the source-end generator and an internal voltage ($E_R$) of the receiving-end generator may be estimated as a function of the obtained voltage $V_S$, the obtained current $I_S$ and an estimated total impedance ($Z=Z_L+Z_R$). In certain embodiments, a power swing condition may be then detected based on the estimated value of θ.

Figure 1:
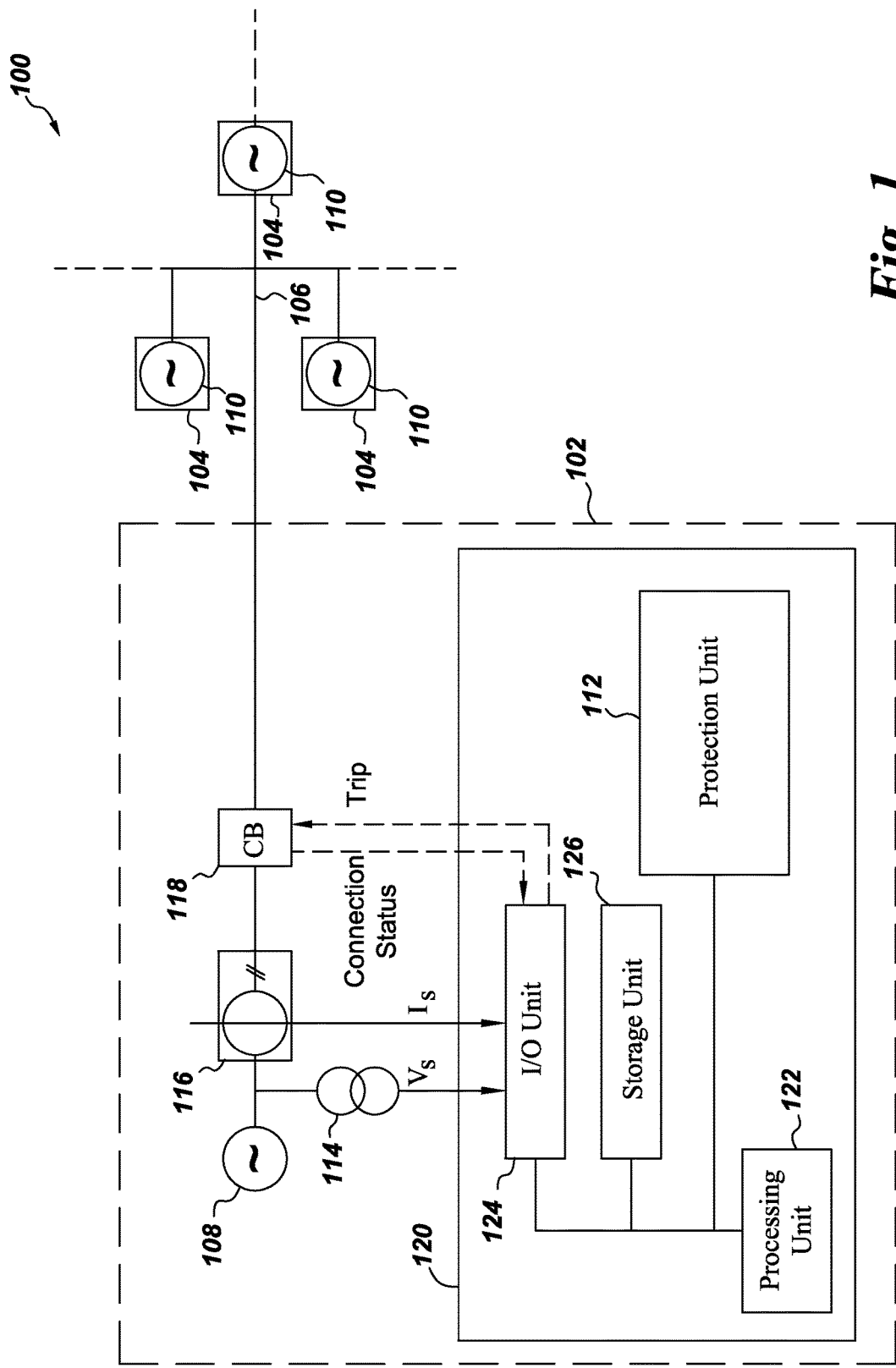
FIG. 1 depicts an electrical power system having multiple generators inter-connected in a mesh arrangement, in accordance with one embodiment.

FIG. 1 depicts an electrical power system 100 (herein referred to as "system 100") having multiple generators 110 and 108 inter-connected in a mesh arrangement, in accordance with one embodiment of the invention. The system 100 may be used for interconnecting alternating current (AC) power grids or microgrids. As shown in FIG. 1, in some embodiments, the system 100 may include a source-end 102 and one or more receiving-ends 104. The term "source-end" as used herein refers to a transmitting end of the system 100 and the term "receiving-end" refers to an end that receives power transmitted from the source-end 102 via a transmission link 106 such as, but not limited to, a transmission cable or a transmission line. As shown in FIG. 1, the source-end 102 includes a generator 108 (herein referred to as a "source-end generator 108") and each receiving-end 104 includes a generator 110 (herein together referred to as "receiving-end generator(s) 110") configured to be electrically coupled to the source-end generator 108. It will be apparent to a person skilled in the art that power swing may occur between any two generators (for example, between the source-end generator 108 and any of receiving-end generators 110) or between two groups of generators. Although FIG. 1 illustrates three receiving-end generators 110, any number of receiving-end generators may be deployed without deviating from the scope of the technique. Similarly, a plurality of source-end generators may be deployed in the system 100 instead of a single source-end generator 108 shown in FIG. 1, in accordance with some embodiments of the invention. In such embodiments, every source-end generator may include, or be coupled to, a protection unit as described later.

A power swing is a system phenomenon that is observed when a phase angle (herein referred to as a "swing angle") of one power source starts to vary in time with respect to another source in the same electrical system network. In some embodiments, the source-end generator 108 and one of the receiving-end generator 110 may be the two power sources. The term "swing angle (θ)" herein refers to a phase angular separation between an internal voltage ($E_S$) of the source-end generator 108 and an internal voltage ($E_R$) of any of the receiving-end generators 110. When a two-source system loses stability and enters an out-of-step (OOS) condition, the angle difference (given by θ) of the two generators, for example, the source-end generator 108 and any of receiving-end generators 110 may increase as a function of time. Therefore, θ provides information about power swing condition in an electrical power system, in accordance with some embodiments.

Components illustrated in the system 100 are exemplary and the system 100 may also include various other components (not shown in FIG. 1) such as, but not limited to, a turbine connected to the source-end generator 108, an automatic voltage regulator (AVR), a step-up transformer, a line-side breaker, and one or more electrical loads, for example.

The source-end 102 further includes a voltage transformer 114 for measuring a voltage phasor ($V_S$) of the source-end generator 108, and a current transformer 116 for measuring a current phasor ($I_S$) of the source-end generator 108. Although a single voltage transformer 114 and a single current transformer 116 are shown in FIG. 1, it will be appreciated by those skilled in the art that any number of current and voltage transformers may be deployed in the system 100 for sensing the local parameters such as $I_S$ and $V_S$. The term "local measurement" herein refers to a parameter that can be measured within the source-end 102 without the need to communicate with receiving-end generators 110. It should be noted that the voltage phasor and the current phasor refer to magnitude and phase angle of voltage and current signals. In some embodiments, the phase angle is separately calculated in a processing system.

As shown in FIG. 1, the system 100 further includes a circuit breaker (CB) 118 at the source-end 102. In some embodiments, the circuit breaker 118 is configured to electrically couple/decouple the source-end generator 108 with/from the receiving-end generators 110. In some embodiments, the circuit breaker 118, the voltage transformer 114 and the current transformer 116 measure the corresponding data (such as, connection status, Vs, Is, and the like) in real-time. As will be described later, the system 100 may also estimate a system parameter such as a transmission line impedance ($Z_L$) between a source-end generator and a receiving-end generator and furthermore, a receiving end generator impedance ($Z_R$), for example. This estimation may be performed in real-time, in accordance with some embodiments. In one embodiment, real-time may refer to the occurrence of event instantaneously, for example, in the order of milliseconds or microseconds. In another embodiment, real-time may be near real-time having a predetermined tolerance (for example, two percent) with respect to instantaneous real-time. In one exemplary embodiment where the data is received near real-time, a utility operator or a protection engineer viewing the data (for example at an I/O terminal) may not perceive any delay during display of data.

As shown in FIG. 1, the system 100 further includes a power swing detection device 120 (herein referred to as "device 120") at the source-end 102. The term "power swing detection device" as used herein refers to a component that is configured to detect power swing and protect the source-end generator 108 during power swing condition. This protection may be achieved by triggering the circuit breaker 118 to trip or by triggering an alarm, when such power swing condition is detected. Tripping the circuit breaker 118 may result in the source-end generator 108 being isolated or decoupled from the rest of the system 100. The device 120 may be a protection relay, such as, but not limited to, a digital, numeric, static, or electromechanical protection relay, in accordance with some embodiments.

Further, as illustrated in FIG. 1, the device 120 may include a processing unit 122 and an I/O unit 124, where the processing unit 122 may analyze data that is received at and transmitted from the I/O unit 124. The processing unit 122 may include, for example, one or more application-specific processors, graphical processing units, digital signal processors, microcomputers, microcontrollers, application specific integrated circuits (ASICs), field programmable gate arrays (FPGAs), or other suitable devices in communication with one or more components of the system 100. The I/O unit 124 may comprise one or more human I/O devices, which enable a utility operator or a protection engineer to communicate with the device 120 or one or more communications devices using any type of communications link. In some embodiments, the I/O unit 124 interfaces with the voltage transformer 114, the current transformer 116, and the circuit breaker 118 to receive local parameters (such as the $V_S$, the $I_S$) and the connection status, respectively. $V_S$ and $I_S$ may be analog inputs, for example, in the form of sine waveforms or square pulses, in accordance with certain embodiments. In one embodiment, the I/O unit 124 is configured to filter noise and then convert the filtered analog input into digital samples. In another embodiment, during the power swing condition, the I/O unit 124 is configured to trigger an alarm, or send a trip command to the circuit breaker 118 to trip the circuit breaker 118, or activate any other protection mechanism to protect the system.

The device 120 may further include a protection unit 112 and a storage unit 126. In some embodiments, the protection unit 112 executes program code, such as a swing detection scheme residing in the storage unit 126. In some embodiments, the protection unit 112 is a relay that is provided with a swing detection scheme to detect whether the system 100 is approaching power swing condition between the source-end generator 108 and any of the receiving-end generators 110 or not. In some alternate embodiments, the processing unit 122 may execute this swing detection scheme. In certain embodiments, the processing unit 122 stores the received, processed, and transmitted data to, or reads from, the storage unit 126, such as a hard disk drive, a floppy disk drive, a compact disk-read/write (CD-R/W) drive, a digital versatile disc (DVD) drive, a flash drive, or a solid-state storage device. In some embodiments, the processing unit 122 may be integrated with the protection unit 112.

Various embodiments of the invention deploy the swing detection scheme in the device 120 that is configured to detect a power swing condition based on real-time data measurements including $V_S$, $I_S$, $Z_L$, and $Z_R$. The term "swing detection scheme" herein refers to logic defined to detect a power swing condition and then selectively, reliably, and dependably protect the source-end generator 108 during unstable power swings, and retain the source-end generator 108 in operation during stable power swings. In some embodiments, where the swing detection scheme determines that the disturbance in the system 100 is an unstable power swing, the device 120 protects the source-end generator 108 by triggering the alarm, generator circuit breaker trip action, or activating any other protection mechanism. The swing detection scheme is described in detail later in conjunction with FIG. 2.

In some embodiments, various components of the device 120 may communicate with each other via a communication bus 136 in the device 120. It should be noted that one or more components shown in FIG. 1 may be integrated into a single component. Also, the functionalities of a component of the device 120 may be segregated or distributed across multiple components. For example, some or all logic of the protection unit 112 may be stored in the storage unit 126 and processed in the processing unit 122. In some embodiments, the functionalities of the I/O unit 124 may be integrated into one or more modules of the protection unit 112, in which case the I/O unit 124 may be omitted.

As used herein, the term "unit" within the device 120 refers to any configuration of hardware, with or without software, which implements the functionality described in conjunction therewith using any solution. Regardless, it is understood that two or more units, modules, or systems may share some or all of their respective hardware or software. Further, while performing a process described herein, the device 120 may communicate with one or more other computing components using any type of communications link. In some embodiments, the communications link may include, but is not limited to, wired links such as optical fiber, or wireless links. Further, the system 100 may further include any combination of one or more types of networks, or utilize any combination of various types of transmission techniques and protocols.

Figure 2:
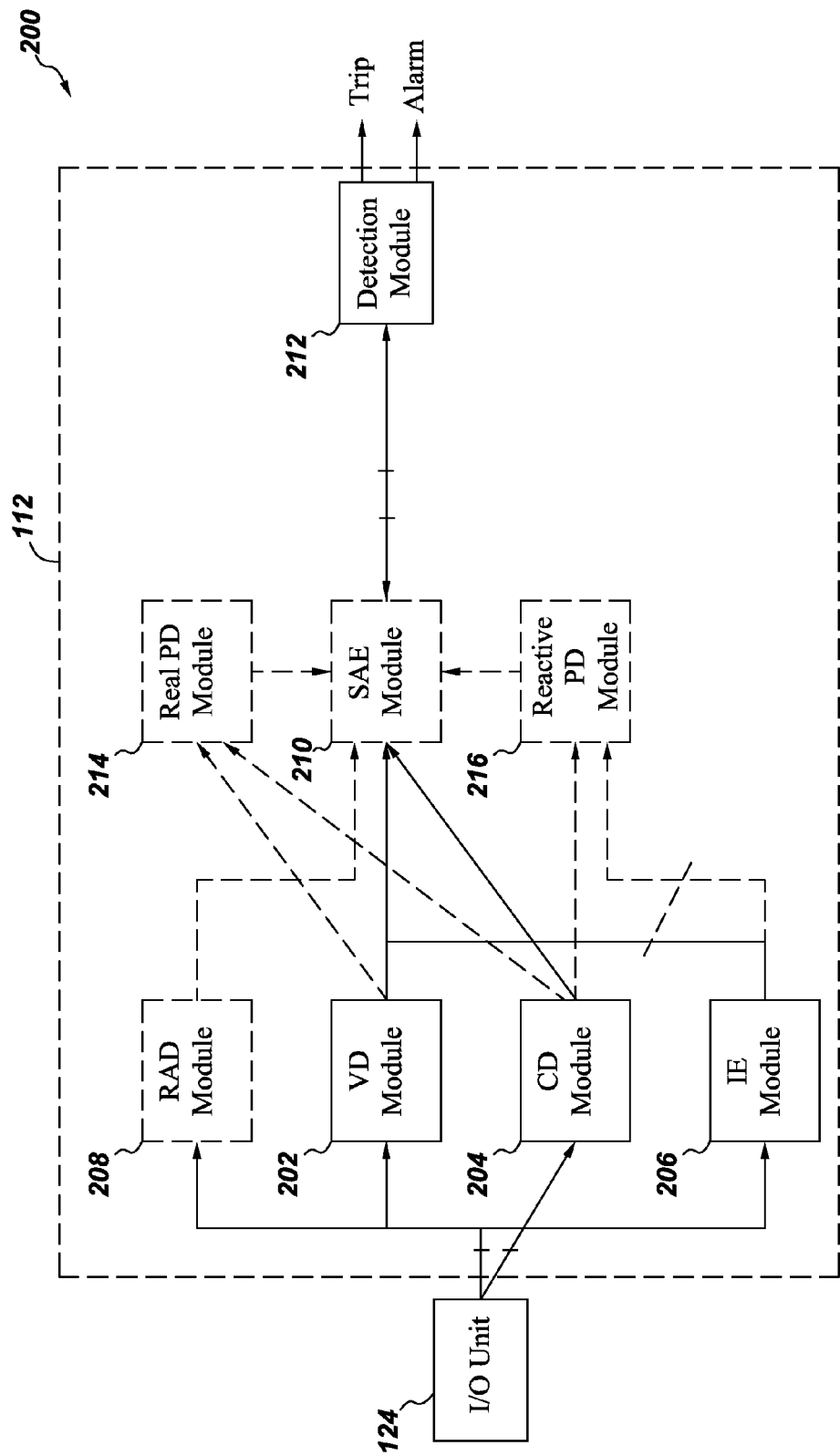
FIG. 2 is a block diagram of a power swing detection device, in accordance with one embodiment.

FIG. 2 is a block diagram of a power swing detection device 200 (herein referred to as "device 200"), in accordance with one embodiment of the invention. The device 200 is similar to the device 120, except that a detailed view of the protection unit 112 is shown in FIG. 2. In some embodiments, various components of the device 120 may be equally implemented in the device 200. As shown in FIG. 2, in some embodiments, the protection unit 112 includes a voltage determination (VD) module 202 coupled to the I/O unit 124 and is configured to obtain a voltage phasor ($V_S$) of the source-end generator 108. The protection unit 112 further includes a current determination (CD) module 204 coupled to the I/O unit 124 and is configured to obtain a current phasor ($I_S$) of the source-end generator 108. In one embodiment, the VD module 202 and the CD module 204 are configured to receive $V_S$ and $I_S$, respectively, from the respective voltage and current transformers 114 and 116. Alternatively, in another embodiment, the VD module 202 and the CD module 204 may be integrated with the respective voltage and current transformers 114 and 116 to measure $V_S$ and $I_S$ directly. In yet another embodiment, a phasor measurement unit (PMU) may be used to measure phasor values such as $V_S$ and $I_S$. In such an embodiment, the voltage and current transformers 114 and 116 may be omitted or implemented in addition to the PMU.

In some embodiments, as shown in FIG. 2, the protection unit 112 further includes an impedance estimation (IE) module 206 coupled to the I/O unit 124 and is configured to estimate a transmission line impedance ($Z_L$) between a source-end generator and a receiving-end generator and furthermore, a receiving end generator impedance ($Z_R$). Various embodiments here consider X as the total reactance for detecting power swing since impedances are generally dominated by reactance instead of resistance. In one exemplary embodiment, the IE module 206 estimates $Z_L$ and $Z_R$ based on generator models and transmission line models. The respective models may be varied over the time as per the changes in the system. Any other known suitable estimation technique may be used to estimate $Z_L$ and $Z_R$ without deviating from the scope of the technique.

In some embodiments, as shown in FIG. 2, the protection unit 112 additionally includes a rotor angle determination (RAD) module 208 coupled to the I/O unit 124 and is configured to obtain a mechanical rotor angle ($\delta s$) of sending end generator 108 with respect to voltage $V_S$. In one exemplary embodiment, $\delta s$ may be obtained as a part of phasor values obtained using the PMU. In other embodiments, commercially available meters may be used to determine the mechanical rotor angle $\delta s$.

In some embodiments, as shown in FIG. 2, the protection unit 112 further includes a swing angle estimation (SAE) module 210 coupled to the modules 202, 204, 206 and 208. In one embodiment, the SAE module 210 is configured to estimate a swing angle ($\theta$) between $E_S$ and $E_R$ as a function of the obtained $V_S$, the obtained $I_S$ and the estimated $Z=Z_L+Z_R$. In another embodiment, the SAE module 210 is configured to estimate the value of $\theta$ as a function of obtained $\delta s$, in addition to the obtained $V_S$, the obtained $I_S$, and the estimated Z. In one embodiment, the value of $\theta$ may be derived from the equations of an internal voltage ($E_S$) of the source-end generator 108, real power (P) and reactive power (Q) given below:

$$E_s = V_s - I_s(Z_L + Z_R) \qquad \text{eq-1}$$

$$P + j \cdot Q = |V_s|^2 - V_s \cdot I_s^* \cdot (Z_L^* + Z_R^*) \qquad \text{eq-2}$$

where $I_S^*$, $Z_L^*$ and $Z_R^*$ dare complex conjugates of $I_S$, $Z_L$ and $Z_R$ respectively. It should be noted that in equation 2 above, the real part of left hand side (LHS) would represent real power P and imaginary part of LHS would represented reactive power Q. The swing angle $\theta$ then may be determined as $$\theta = a\tan 2(Q,P) + \delta_s \qquad \text{eq-3}$$

Further, a rate of change of $\theta$ ($\dot{\theta}$) may be determined as:

$$\dot{\theta} = 2 \times \left( \frac{P \times \dot{Q} - Q \times \dot{P}}{P^2 + Q^2} \right) \qquad \text{eq-4}$$

where $\dot{P}$ and $\dot{Q}$ are the rate of change of P and Q respectively. $\dot{P}$ and $\dot{Q}$ may be determined using the following equations:

$$\dot{P} = \frac{P(t(k)) - P(t(k-1))}{t(k) - t(k-1)} \qquad \text{eq-5}$$

$$\dot{Q} = \frac{Q(t(k)) - Q(t(k-1))}{t(k) - t(k-1)} \qquad \text{eq-6}$$

where, P(t(k)) represents a real power measured at a time instance t(k), P(t(k−1)) represents a real power measured at a time instance t(k−1), t(k−1) is a time instance prior to t(k), Q(t(k)) represents a reactive power measured at the time instance t(k), and Q(t(k−1)) represents a reactive power measured at the time instance t(k−1).

It should be noted that the measured signals VS and IS may need to be converted into digital signals with analog to digital (A/D) converters. Furthermore, all the equations above may need to be converted into digital domain (e.g., z domain) for implementing in the processor.

In some embodiments, as shown in FIG. 2, the protection unit 112 further includes a detection module 212 coupled to the SAE module 210. The detection module 212 in such embodiments is configured to detect power swing based on the estimated $\theta$. Any known technique of detecting power swing based on $\theta$ may be used herein without deviating from the scope of the invention. In one exemplary embodiment, a threshold value is defined and compared with the estimated $\theta$. In such an embodiment, when $\theta$ exceeds this defined threshold value, the system is defined as out-of-step or unstable, as a result of which the circuit breaker 118 is tripped to isolate the source-end generator 108 from the rest of the system 100, or an alarm is triggered.

In some other embodiments, the SAE and detection modules 210 and 212 may use additional parameter(s) to detect power swing. In one such embodiment, the protection unit 112 includes a real power determination (real PD) module 214 and a reactive power determination (reactive PD) module 216. In one embodiment, the real PD module 214 is configured to determine P and the reactive PD module 216 is configured to determine a reactive power value Q based on the obtained $V_S$, $I_S$ and Z as explained with respect to equation 2.

The SAE module 210 may also be configured to estimate an additional parameter such as a rate of change of swing angle ($\dot{\theta}$) as a function of the P and Q determined using the modules 214 and 216, respectively, as explained with respect to equation 4.

In certain embodiments, the detection module 212 may be configured to detect the power swing based on the estimated $\theta$ and $\dot{\theta}$. Any known technique of detecting power swing based on θ and θ̇ may be used herein without deviating from the scope of the invention. In one exemplary embodiment, during a power swing, the swing energy transfers back and forth between θ and θ̇; therefore the power swing or an out-of-step condition may be detected using a weighted sum of the squares of θ and θ̇. In one such embodiment, power swing or out-of-step condition is determined when the below condition is met:

$$\left(\frac{\theta}{\theta_{max}}\right)^2 + \left(\frac{\dot{\theta}}{\dot{\theta}_{max}}\right)^2 > 1 \qquad \text{eq-7}$$

where, $\theta_{max}$ and $\dot{\theta}_{max}$ are maximum allowed swing angle and maximum allowed rate of change of swing angle, respectively.

In some other embodiments, after detecting the power swing, the device 200 determines whether the power swing is stable or unstable. Any known technique may be used for determining stable or unstable power swing. In one exemplary embodiment, when θ increases for some time duration and then starts to decrease, such a power swing is determined as a stable swing. However, when θ increases continuously for the entire monitored time duration, such a power swing is determined as an unstable swing.

Figure 3:
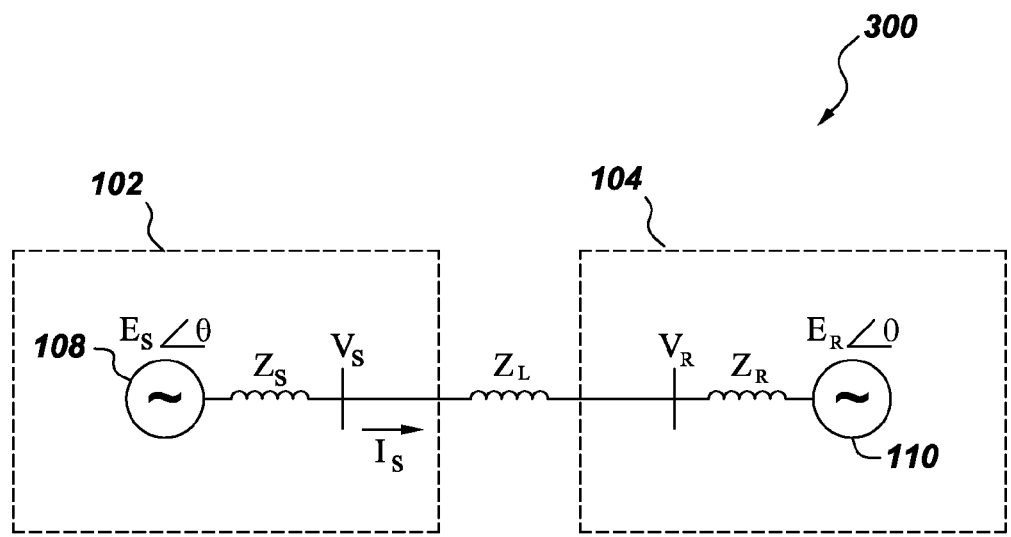
FIG. 3 represents a two-source system and a vector phasor representation of the two-source system, in accordance with one embodiment of the invention.
Figure 3:
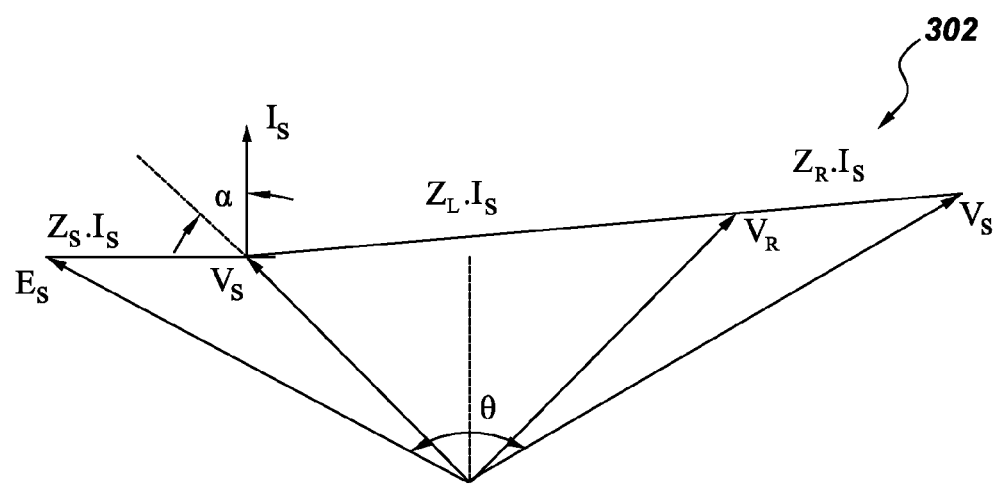

FIG. 3 represents a two-source system 300 and a vector phasor representation 302 of the two-source system 300, that is, the source-end 102 and the receiving-end 104, in accordance with one embodiment. The two-source system 300 is a configuration of a simplest network for studying the power swing phenomenon, as shown in FIG. 3. The source-end generator (108) internal voltage $E_S$ has a swing angle equal to θ, and this angle may vary with respect to the receiving end generator (110) internal voltage $E_R$ during the power swing. The receiving-end generator 110 represents an infinite bus and $E_S$ is considered a reference voltage i.e., it is assumed that it not vary with time rather other phasors vary with respect to $E_S$. This simple network may be used to model the power swings taking place in more complex networks. In some embodiments, when the two-source system 300 loses stability and enters a power swing condition, the angle difference between the two sources 108 and 110, represented by θ, may increase as a function of time.

Figure 4:
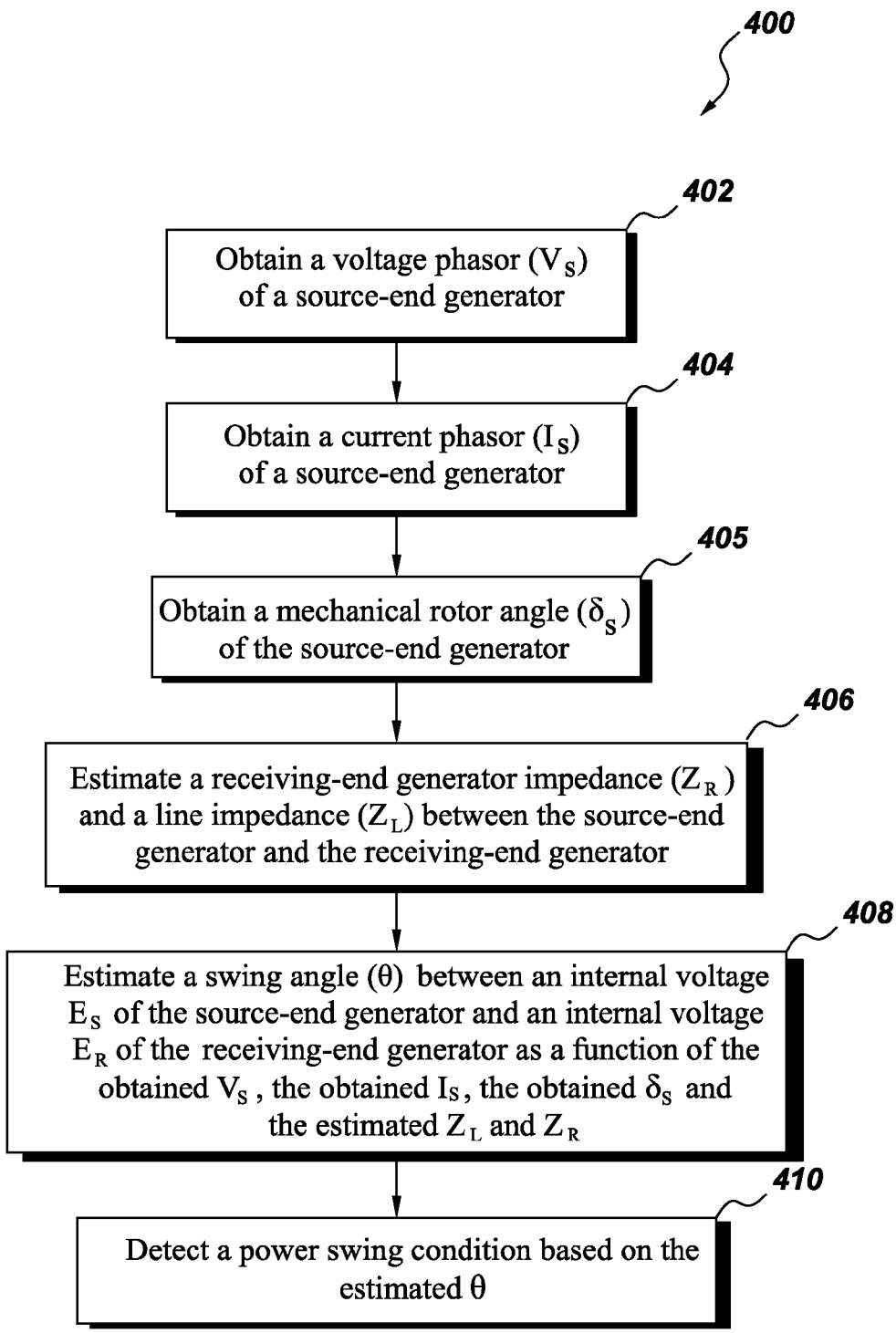
FIG. 4 is a flowchart depicting a method for detection of power swing in the electrical power system, in accordance with one embodiment of the invention.

FIG. 4 is a flowchart depicting a method 400 for detecting power swing in an electrical power system (such as 100), in accordance with one embodiment of the invention. The method 400 detects power swing between a source-end generator (such as 108) and a receiving-end generator (such as one of the receiving-end generators 110) based on local measurements and one or more system parameters. In some embodiments, a power swing detection device (such as 120) including a protection unit (such as 112), for example, a relay may be provided with a swing detection scheme to detect power swing between the source-end generator and receiving-end generators. At steps 402 and 404, local measurements including a voltage phasor ($V_S$) and a current phasor ($I_S$) of the source-end generator are obtained. In some embodiments, a voltage determination (VD) module (such as 202) obtains $V_S$ and a current determination (CD) module (such as 204) obtains $I_S$. In one embodiment, the VD and CD modules are configured to receive $V_S$ and $I_S$, respectively, from respective current (such as 116) and voltage transformers (such as 114). Alternatively, in another embodiment, these modules may be integrated with the respective current and voltage transformers to measure $V_S$ and $I_S$ directly. In yet another embodiment, a phasor measurement unit (PMU) may be used to measure phasor values such as $V_S$ and $I_S$. Furthermore, at step 405, a mechanical rotor angle (δs) is obtained. In one embodiment, a RAD module (such as 208) obtains δs.

Further, at step 406, a transmission line impedance ($Z_L$) between a source-end generator and a receiving-end generator and furthermore, a receiving end generator impedance ($Z_R$) is estimated. In one embodiment, an impedance estimation (IE) module (such as 206) estimates total impedance $Z=Z_L+Z_R$. The impedances $Z_L$ and $Z_R$ may be determined based on some modeling techniques or any other known estimation technique may be used to estimate $Z_L$ and $Z_R$ without deviating from the scope of the invention.

At step 408, a first swing angle (θ) between $E_S$ and $E_R$ is estimated as a function of the obtained $V_S$, the obtained $I_S$, the obtained δs and the estimated X. In one embodiment, a SAE module (such as 210) is used to estimate θ as a function of the obtained $V_S$, the obtained $I_S$ and the estimated $Z_L$ and $Z_R$. θ may be computed as described above in various embodiments of FIG. 2.

Finally, at step 410, the power swing is detected based on the estimated value of θ. Any known technique of detecting power swing based on θ may be used herein without deviating from the scope of the invention. In one exemplary embodiment, a threshold value may be defined and a detection module (such as 212) may be used to compare the estimated θ with this threshold value. In such an embodiment, when the value of θ exceeds this defined threshold value, the system is determined to be out-of-step or unstable, as a result of which the circuit breaker 118 is tripped to isolate the source-end generator 108 from the rest of the system 100, or an alarm is triggered.

In some other embodiments, the SAE and detection modules may use additional parameter(s) such as a rate of change of swing angle (θ̇) as a function of the P and Q to detect power swing. θ̇ may be estimated as described above in various embodiments of FIG. 2. In certain embodiments, the detection module 212 may be configured to detect the power swing based on the estimated θ and θ̇. Any known technique of detecting power swing based on θ and θ̇ may be used herein without deviating from the scope of the invention. In one exemplary embodiment, power swing or out-of-step condition may be determined as per equation 7.

It is to be understood that a skilled artisan will recognize the interchangeability of various features from different embodiments and that the various features described, as well as other known equivalents for each feature, may be mixed and matched by one of ordinary skill in this art to construct additional systems and techniques in accordance with principles of this disclosure. It is, therefore, to be understood that the appended claims are intended to cover all such modifications and changes as fall within the true spirit of the invention.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A method, comprising:
obtaining a voltage phasor ($V_S$) of a source-end generator;
obtaining a current phasor ($I_S$) of the source-end generator;
obtaining a mechanical rotor angle (δs) of the source end generator;

estimating a receiving end generator impedance ($Z_R$) and a line impedance ($Z_L$) between the source-end generator and the receiving-end generator;

estimating a swing angle (θ) between an internal voltage $E_S$ of the source-end generator and an internal voltage $E_R$ of the receiving-end generator as a function of the obtained $V_S$, the obtained $I_S$, the obtained δs and the estimated $Z_L$ and $Z_R$;

detecting a power swing condition based on the estimated θ; and tripping a circuit breaker to isolate the source-end generator from the rest of the system when the power swing condition is detected.

2. The method of claim 1, wherein estimating the swing angle (θ) comprises determining a real power value (P) and a reactive power value (Q) based on the obtained $V_S$ and the obtained $I_S$ and the estimated $Z_L$ and $Z_R$.

3. The method of claim 2 further comprising estimated a rate of change of swing angle ($\dot{θ}$).

4. The method of claim 3, wherein estimating the rate of change of swing angle comprises estimating the rate of change of swing angle ($\dot{θ}$) as a function of the mechanical rotor angle (δs), the determined P and the determined Q.

5. The method of claim 4, wherein the detecting the power swing condition comprises detecting the power swing condition based on the estimated θ and $\dot{θ}$.

6. A system comprising:
a power swing detection device, comprising:
a voltage determination module configured to obtain a voltage phasor ($V_S$) of a source-end generator;
a current determination module configured to obtain a current phasor ($I_S$) of the source-end generator;
a rotor angle determination module configured to obtain a mechanical rotor angle (δs) of the source end generator;
an impedance estimation module configured to estimate a receiving end generator impedance ($Z_R$) and a line impedance ($Z_L$) between the source-end generator and the receiving-end generator;
a swing angle estimation module configured to estimate a swing angle (θ) between an internal voltage $E_S$ of the source-end generator and an internal voltage $E_R$ of the receiving-end generator as a function of the obtained $V_S$, the obtained $I_S$, the obtained δs and the estimated $Z_L$ and $Z_R$;
a detection module configured to detect a power swing condition based on the estimated θ; and
a circuit breaker to isolate the source-end generator from the rest of the system when the power swing condition is detected.

7. The power swing detection device of claim 6, further comprising:
a real power determination module configured to determine a real power value (P) based on the obtained $V_S$ and the obtained $I_S$ and the estimated $Z_L$ and $Z_R$.

8. The power swing detection device of claim 7, further comprising:

a reactive power determination module configured to determine a reactive power value (Q) based on the obtained $V_S$ and the obtained $I_S$ and the estimated $Z_L$ and $Z_R$.

9. The power swing detection device of claim 8, wherein the swing angle estimation module is configured to estimate a rate of change of swing angle ($\dot{θ}$) as a function of the determined P and the determined Q.

10. The power swing detection device of claim 9, wherein the detection module is configured to detect the power swing condition based on the estimated θ and estimated $\dot{θ}$.

11. An electrical power system, comprising:
a receiving-end generator;
a source-end generator configured to be electrically coupled to the receiving-end generator;
a power swing detection device, comprising:
a voltage determination module configured to obtain a voltage phasor ($V_S$) of the source-end generator;
a current determination module configured to obtain a current phasor ($I_S$) of the source-end generator;
a rotor angle determination module configured to obtain a mechanical rotor angle (δs) of the source end generator;
an impedance estimation module configured to estimate a receiving end generator impedance ($Z_R$) and a line impedance ($Z_L$) between the source-end generator and the receiving-end generator;
a swing angle estimation module configured to estimate a swing angle (θ) between an internal voltage $E_S$ of the source-end generator and an internal voltage $E_R$ of the receiving-end generator as a function of the obtained $V_S$, the obtained $I_S$, the obtained δs and the estimated $Z_L$ and $Z_R$; and
a detection module configured to detect a power swing condition based on the estimated θ; and
a circuit breaker to isolate the source-end generator from the rest of the system when the power swing condition is detected.

12. The electrical power system of claim 11, further comprising:
a real power determination module configured to determine a real power value (P) based on the obtained $V_S$ and the obtained $I_S$ and the estimated $Z_L$ and $Z_R$.

13. The electrical power system of claim 12, further comprising:
a reactive power determination module configured to determine a reactive power value (Q) based on the obtained $V_S$ and the obtained $I_S$ and the estimated $Z_L$ and $Z_R$.

14. The electrical power system of claim 13, wherein the swing angle estimation module is configured to estimate a rate of change of swing angle ($\dot{θ}$) as a function of the determined P and the determined Q.

15. The electrical power system of claim 14, wherein the detection module is configured to detect the power swing condition based on the estimated θ and estimated $\dot{θ}$.

\* \* \* \* \*